Jan. 27, 1970 D. J. ROTIER 3,492,589
FAILSAFE CIRCUIT APPARATUS
Filed April 3, 1967
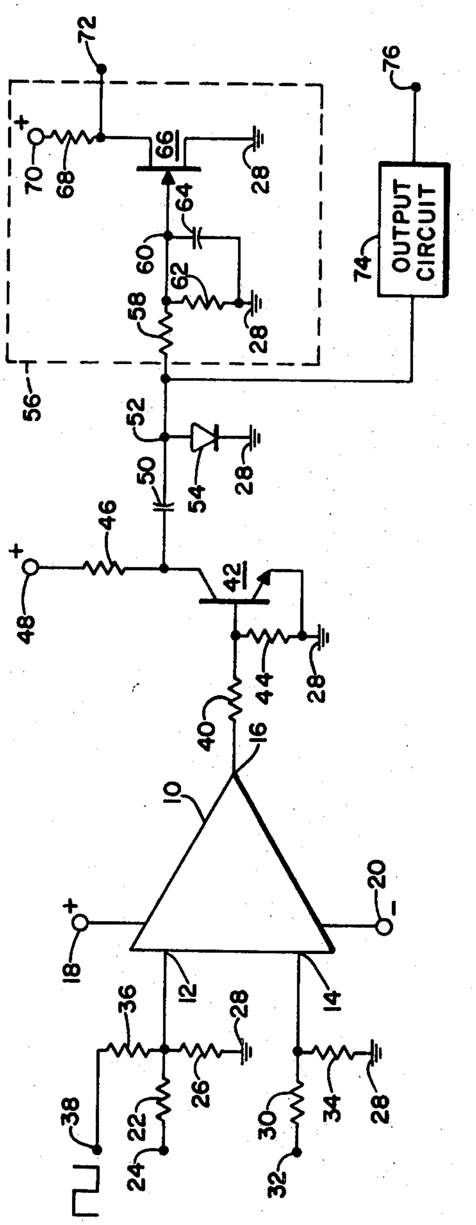
INVENTOR.
DONALD J. ROTIER
BY Bruce C Lutz
ATTORNEY

United States Patent Office 3,492,589

Patented Jan. 27, 1970

3,492,589

FAILSAFE CIRCUIT APPARATUS

Donald J. Rotier, St. Paul, Minn., assignor to Honeywell Inc., Minneapolis, Minn., a corporation of Delaware Filed Apr. 3, 1967, Ser. No. 627,967

Int. Cl. H03k 5/20

U.S. Cl. 328—146 1 Claim

ABSTRACT OF THE DISCLOSURE

The disclosure illustrates how the input and output circuits of a voltage differential detection system may be designed so that a fail safe condition is obtained. That is, the output upon failure of any of the parts will be the same as if a greater than desirable voltage input differential had occurred.

The present invention is related generally to detection apparatus and more specifically to high reliability circuits for providing fail safe indications of a voltage differential.

In view of the above, it is an object of this invention to improve the reliability of electronic detection circuitry.

Other objects and advantages of the present invention will be obvious from the specification and claims along with the single figure which shows a schematic of one embodiment of the invention.

In the drawing an amplifying means or switching means 10 is shown with differential inputs 12 and 14 and an output 16. In addition, power terminals 18 and 20 which are positive and negative respectively are connected to supply power to the amplifier 10. A resistance or impedance means 22 is connected between an input means 24 for supplying one of the direct voltage input signals and input 12. A second resistor 26 is connected between input 12 and ground or reference potential 28. As will be noted, there is no direct connection shown of reference potential 28 to the amplifier 10 but such a connection may be desirable in some embodiments of the invention. A resistor 30 is connected between a second signal input 32 and input 14 of amplifier 10. A resistor 34 is connected between input 14 and ground 28. A resistance means 36 is connected between input 12 and a reference signal input 38. The signal supplied to reference signal input 38 is a square wave of an amplitude dictated by the impedance value of the previously recited resistors and the maximum voltage differential desired between input terminals 24 and 32. A resistor 40 is connected between output 16 of amplifier 10 and a base of a transistor generally designated as 42. An emitter of transistor 42 is connected to ground 28. A resistor 44 is connected between the base and emitter of transistor 42. A resistor 46 is connected between a collector of transistor 42 and a positive power terminal 48 which may be the same as terminal 18. A capacitor 50 is connected between the collector of transistor 42 and a junction point 52. A diode 54 is connected between junction point 52 and ground 28. The diode 54 is connected so tht the direction of easy current flow is toward ground 28 or in other words the cathode of the diode 54 is connected to ground 28. Within a dashed line box 56 there is a resistive means 58 which is connected between the previously mentioned junction point 52 and a junction point 60. A resistor 62 is connected in parallel with a capacitor 64 between junction point 60 and ground 28. A gate of a field effect transistor 66 is connected to junction point 60 while the drain is connected to ground 28 and the source is connected through a resistor 68 to a positive power source 70 which may be the same as power source 18. The source of transistor 66 is further connected to an output terminal 72. The components 58, 62, and 64 form a filter within the box 56 which is merely an output circuit for the previously described apparatus. Since the previously described apparatus will provide sufficient power to provide more than one output indication, a second output circuit 74 is shown connected between junction point 52 and its output terminal 76. The box 74 may have the same general circuit configuration as shown within dashed lines 56.

The components 40, 42, 44, 46, 50, and 54 provide a rectifying circuit. While this is an apparently complicated rectifying circuit, it has a fail safe feature in that failure of one or more of the components will still provide an output potential which is different from that provided if everything is operating satisfactorily and the input potential is less than the predetermined amount.

Thus far in the specification, the various components have been designated by one name for convenience. However, it is to be realized that the term resistor means is meant to include other components which would accomplish the same end result as taught by the invention. Similarly, the term transistor is meant to include other types of switching means and amplifying means or semiconductor means which will accomplish the desired result. The capacitive means also includes other types of impedance means while the diode 54 is expected to include other types of semiconductor devices which will accomplish the rectifying function. The amplifier 10 in one embodiment was a Fairchild UA709 integrated circuit amplifier. However, other amplifying means or differential saturating switch means could be used if they performed in substantially the same manner.

In explaining the operation of the circuit shown, It will first be assumed that the direct voltage signals at terminals 24 and 32 are of the same potential and that there is an alternating signal applied to terminal 38. As previously mentioned, the signal at terminal 38 is a square wave signal. Under these conditions, it can be seen that the square wave signal summed with the signal at terminal 24 will produce an alternating signal at input 12. This alternating signal will become alternately positive and negative with respect to the terminal 14. The amplifier 10 is a high gain amplifier such that it takes only a small voltage difference between inputs 12 and 14 to provide a saturated output condition. Thus, the output signal at output 16 will be a square wave signal of an amplitude proportional to the voltage at the power terminal 18 and 20. The signal will alternately activate and deactivate transistor 42 so that an alternating signal which alternates between ground and the positive power terminal 48 is applied through capacitor 50 to the diode 54. When transistor 42 is OFF, the capacitor charges up to the voltage of terminal 48. When transistor 42 is ON, the electrode of capacitor 50 which is connected to the diode is negative and thus reverse biases diode 54. As will be realized, without a filter of some type in the output, the signal at terminal 52 would merely be an alternating signal. However, the capacitor 64 is charged to a negative potential upon each occasion of transistor 42 turning ON. Thus, a negative potential is applied to the transistor 66 to keep it in an OFF condition and thus keep the output at a high potential. However, if there is some failure such as the power supplies, the power output will drop to zero. If the capacitor 50 were to fail in an open condition, no signal would get through and the transistor 66 would again be unbiased so that it would turn ON. If capacitor 50 were to "short", the junction point 52 would be raised to a positive potential and thus relieve the negative bias from transistor 66. If the diode 54 were to "short", the output could not go negative but would remain at ground. Again, the FET would provide a ground condition at the output terminal 72 since transistor 66 would be ON. If the diode 54 were to open, an alternating condition would be obtained at junction point 52 but this alternating signal would be filtered and presented as an essentially ground potential at the gate of transistor 66. It has been assumed that while a resistor can fail in an open condition, it can never fail in a "shorted" condition. Thus, as can be seen, if either of the resistors 40 or 46 were to fail in an open condition, there would be no signal applied to junction point 52. If resistor 44, which is not essential to the operation of the circuit, but is merely shown for a voltage dividing effect, were to fail, nothing would happen except that possibly the transistor 42 would be burned out and again no signal would get through. If transistor 42 were to "short", then there would be no alternating signal applied to capacitor 50. Under these conditions, the capacitor 64 would discharge and present a ground signal to the transistor 66. Any failure within amplifier 10 will merely prevent an alternating signal from being obtained at the output. Failure of either of the resistors 22 or 30 will provide more than the desired differential between inputs 12 and 14 of amplifier 10 if either one of the direct voltage input signals is larger than the undesirable differential. If either of the resistors 26 or 34 open, and again these two resistors are not part of the invention, the signal to the amplifier will be increased by such a large amount that the amplifier will remain saturated in one direction. If resistor 36 is opened, then there will be no alternating component to the amplifier and thus no alternating output to the rectifying circuit.

So far in the discussion of the operation, the signal has been assumed to always be alternating in polarity at one input such as 12 with respect to the input 14 and only the fail safe provisions of the circuit have been discussed. However, it can be easily determined that if the input at terminal 24 has a greater than predetermined amount of voltage differential with respect to that at input 32, the alternating component of the signal applied at 38 will remain at a given polarity with respect to that supplied at input 14. In other words, while a signal at 12 will be of a given DC voltage and will be alternating at some lesser value with respect to that voltage, it will always remain of the same polarity with respect to input 14. Under these conditions, the output from amplifier 10 will remain saturated in the same direction at all times. Thus, since the output from amplifier 10 is unipolar, there will be no alternating signal to be passed through capacitor 50 and thus the output at terminal 72 will remain in a grounded condition signaling that the input potentials are greater than the prescribed amount or that there is a failure somewhere in the circuit. In either event, it will be known that the system which the device is monitoring requires checking.

It should be noted that the signal differential between inputs 12 and 14 necessary to prevent an alternating output is a difference only slightly greater than the peak voltage of the alterntaing input and not the peak-to-peak voltage. Further, the fail safe conditions extend only up to the junction point 52. As will be noted, failure of capacitor 64 in an open condition will provide an unsatisfactory output from terminal 72 in some conditions of failure of the previous circuitry. It is possible that some fail safe filters can be designed using the previous teachings of the invention and it is not considered a limitation of the invention in having this one unsafe failure condition. In fact, since the output at terminal 52 can drive more than one output circuit, the use of two output circuits such as shown will provide very high reliability since failure of a capacitor in the open condition is a fairly remote occurrence.

While only one embodiment of the invention has been shown, it will be realized that other embodiments may be designed and still fall within the teaching of the invention. Thus, the output from the amplifying means 10 remains unipolar when there is a failure in the circuit or when the signals being monitored are greater than the prescribed maximum differential.

The invention described and claimed herein resulted from work done under United States Government contract FA–SS–66–7; the United States Government has an irrevocable, nonexclusive license under this application to practice and have practiced the invention claimed herein, including the unlimited right to sublicense others to practice and have practiced the claimed invention.

I claim:

1. Apparatus for providing fail-safe indications whenever a part thereof fails or when two signals being monitored exceed a predetermined difference in magnitude comprising, in combination:

means for providing differential switching at an output thereof in response to changes in polarity at one input thereof with respect to a second input applied thereto;

means for supplying a first signal to be monitored at one input of said last named means;

means for supplying a second signal to be monitored at the other input of said means for providing differential switching;

means for supplying an alternating toggling signal at one of the inputs of said means for supplying the differential switching;

means for supplying power between first and second terminals;

reference potential means connected to one of said first and second terminals;

means for inverting a signal connected to said means for supplying power and connected to receive an output signal from said means for providing differential switching;

output means for providing an output indication of one sense when a direct voltage signal is received and for providing an output of a second sense when other types of signals are received;

means for providing direct voltage blocking;

means for rectifying a signal; and means connecting said last two mentioned means in series between said means for inverting and said output means.

References Cited

UNITED STATES PATENTS

| | | | |
|---|---|---|---|
| 3,390,387 | 6/1968 | Hugenholtz | 340—248 |
| 3,149,243 | 9/1964 | Garfield | 307—228 |
| 3,210,749 | 10/1965 | Magor | 307—235 X |
| 3,252,058 | 5/1966 | Close | 340—248 X |
| 3,316,353 | 4/1967 | Dersch | 307—262 |
| 3,381,141 | 4/1968 | Millon | 307—236 |

JOHN S. HEYMAN, Primary Examiner

STANLEY D. MILLER, Assistant Examiner

U.S. Cl. X.R.

328—148, 149; 340—248; 307—231, 235, 236